(12) United States Patent
Ando et al.

(10) Patent No.: US 10,978,551 B2
(45) Date of Patent: Apr. 13, 2021

(54) SURFACE AREA ENHANCEMENT FOR STACKED METAL-INSULATOR-METAL (MIM) CAPACITOR

(71) Applicant: INTERNATIONAL BUSINESS MACHINES CORPORATION, Armonk, NY (US)

(72) Inventors: Takashi Ando, Tuckahoe, NY (US); Eduard A. Cartier, New York, NY (US); Hemanth Jagannathan, Niskayuna, NY (US); Paul C. Jamison, Poestenkill, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/832,250

(22) Filed: Dec. 5, 2017

(65) Prior Publication Data

US 2018/0277621 A1    Sep. 27, 2018

Related U.S. Application Data

(63) Continuation of application No. 15/469,860, filed on Mar. 27, 2017.

(51) Int. Cl.
*H01L 49/02* (2006.01)
*H01L 23/522* (2006.01)
(Continued)

(52) U.S. Cl.
CPC .......... *H01L 28/91* (2013.01); *H01L 21/0228* (2013.01); *H01L 21/02181* (2013.01); *H01L 21/02189* (2013.01); *H01L 21/28568* (2013.01); *H01L 23/5223* (2013.01); *H01L 28/60* (2013.01); *H01L 28/75* (2013.01); *H01L 23/481* (2013.01); *H01L 28/40* (2013.01); *H01L 28/90* (2013.01)

(58) Field of Classification Search
CPC ....................................................... H01L 28/60
USPC ............................................................ 438/396
See application file for complete search history.

(56) References Cited

U.S. PATENT DOCUMENTS 5,068,199 A    11/1991    Sandhu
5,970,360 A    10/1999    Cheng et al.
(Continued)

OTHER PUBLICATIONS

Black et al., "High-Capacity, Self-Assembled Metal-Oxide-Semiconductor Decoupling Capacitors", IEEE Electron Device Letters, vol. 25, No. 9. Aug. 30, 2004. pp. 622-624.
(Continued)

*Primary Examiner* — Mohammad M Choudhry
(74) *Attorney, Agent, or Firm* — Tutunjian & Bitetto, P.C.; Kurt Goudy

(57) ABSTRACT

A method for forming a metal-insulator-metal (MIM) capacitor on a semiconductor substrate is presented. The method includes forming a first electrode defining columnar grains, forming a dielectric layer over the first electrode, and forming a second electrode over the dielectric layer. The first and second electrodes can be titanium nitride (TiN) electrodes. The dielectric layer can include one of hafnium oxide and zirconium oxide deposited by atomic layer deposition (ALD). The ALD results in deposition of high-k films in grain boundaries of the first electrode.

15 Claims, 4 Drawing Sheets

(51) Int. Cl.
*H01L 21/02* (2006.01)
*H01L 21/285* (2006.01)
*H01L 23/48* (2006.01)

(56) References Cited

U.S. PATENT DOCUMENTS

| | | | |
|---|---|---|---|
| 6,060,735 | A | 5/2000 | Izuha et al. |
| 6,153,465 | A | 11/2000 | Jenq et al. |
| 6,159,793 | A | 12/2000 | Lou |
| 6,358,810 | B1 * | 3/2002 | Dornfest .............. H01L 28/55 |
| | | | 257/E21.009 |
| 6,358,813 | B1 | 3/2002 | Holmes et al. |
| 6,780,704 | B1 | 8/2004 | Raaijmakers et al. |
| 7,253,102 | B2 | 8/2007 | Basceri et al. |
| 8,993,404 | B2 | 3/2015 | Korbrinsky et al. |
| 2003/0076023 | A1 * | 4/2003 | Komoda ............... B82Y 10/00 |
| | | | 313/310 |
| 2003/0168750 | A1 | 9/2003 | Basceri et al. |
| 2004/0058504 | A1 | 3/2004 | Kellar et al. |
| 2004/0135186 | A1 * | 7/2004 | Yamamoto ......... H01L 21/3142 |
| | | | 257/296 |
| 2004/0145855 | A1 | 7/2004 | Block et al. |
| 2004/0222493 | A1 * | 11/2004 | Sato ..................... H01G 4/005 |
| | | | 257/532 |
| 2007/0166911 | A1 | 7/2007 | Lo et al. |
| 2015/0311273 | A1 * | 10/2015 | Lin ....................... H01L 28/40 |
| | | | 257/532 |
| 2018/0061931 | A1 * | 3/2018 | Shreiber ............... H01L 28/55 |

OTHER PUBLICATIONS

Fischer et al., "Low-k Interconnect Stack with multi-layer Air Gap and Tri-Metal-Insulator-Metal Capacitors for 14nm High Volume Manufacturing", IEEE Materials for Advanced Metallization at 2015 Interconnect Technology Conference. May 18-21, 2015. pp. 5-7.

Liao et al., "A manufacturable interposer MIM decoupling capacitor with robust thin high-K dielectric for heterogeneous 3D IC CoWoS wafer level system integration", 2014 IEEE International Electron Devices Meeting. Dec. 15-17, 2014. pp. 1-4.

Watanabe et al., "A Novel Stacked Capacitor with Porous-Si Electrodes for high Density DRAMs", Digest of Technical Papers from 1993 Symposium on VLSI Technology. May 17-19, 1993. pp. 17 & 18.

* cited by examiner

Plurality of Grain Lines

SURFACE AREA ENHANCEMENT FOR STACKED METAL-INSULATOR-METAL (MIM) CAPACITOR

BACKGROUND

Technical Field

The present invention relates generally to semiconductor devices, and more specifically, to surface area enhancement for a stacked metal-insulator-metal (MIM) capacitor.

Description of the Related Art

Metal-insulator-metal (MIM) capacitors have been extensively utilized in the fabrication of integrated circuits. A MIM capacitor typically includes a MIM capacitor dielectric situated between lower and upper metal plates, which form the electrodes of the MIM capacitor. MIM capacitors are used for various applications, such as dynamic random access memory (DRAM) capacitors and decoupling capacitors. For both applications, a higher capacitance density of MIM capacitors is required to maintain a sufficiently high total capacitance as the device dimension is scaled.

SUMMARY

In accordance with an embodiment, a method is provided for forming a metal-insulator-metal (MIM) capacitor. The method includes forming a first electrode defining columnar grains, forming a dielectric layer over the first electrode, and forming a second electrode over the dielectric layer. Deposition of the dielectric layer results in deposition of high-k films in grain boundaries of the first electrode.

In accordance with an embodiment, a method is provided for forming a high capacitance density stacked capacitor structure. The method includes forming an electrode over an interlayer dielectric (ILD), the electrode including columnar grains, and forming a high-k insulator over the electrode by atomic layer deposition (ALD).

In accordance with another embodiment, a semiconductor device for forming a metal-insulator-metal (MIM) capacitor is provided. The semiconductor device includes a first electrode defining columnar grains, a dielectric layer formed over the first electrode, and a second electrode formed over the dielectric layer. Deposition of the dielectric layer results in deposition of high-k films in grain boundaries of the first electrode.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
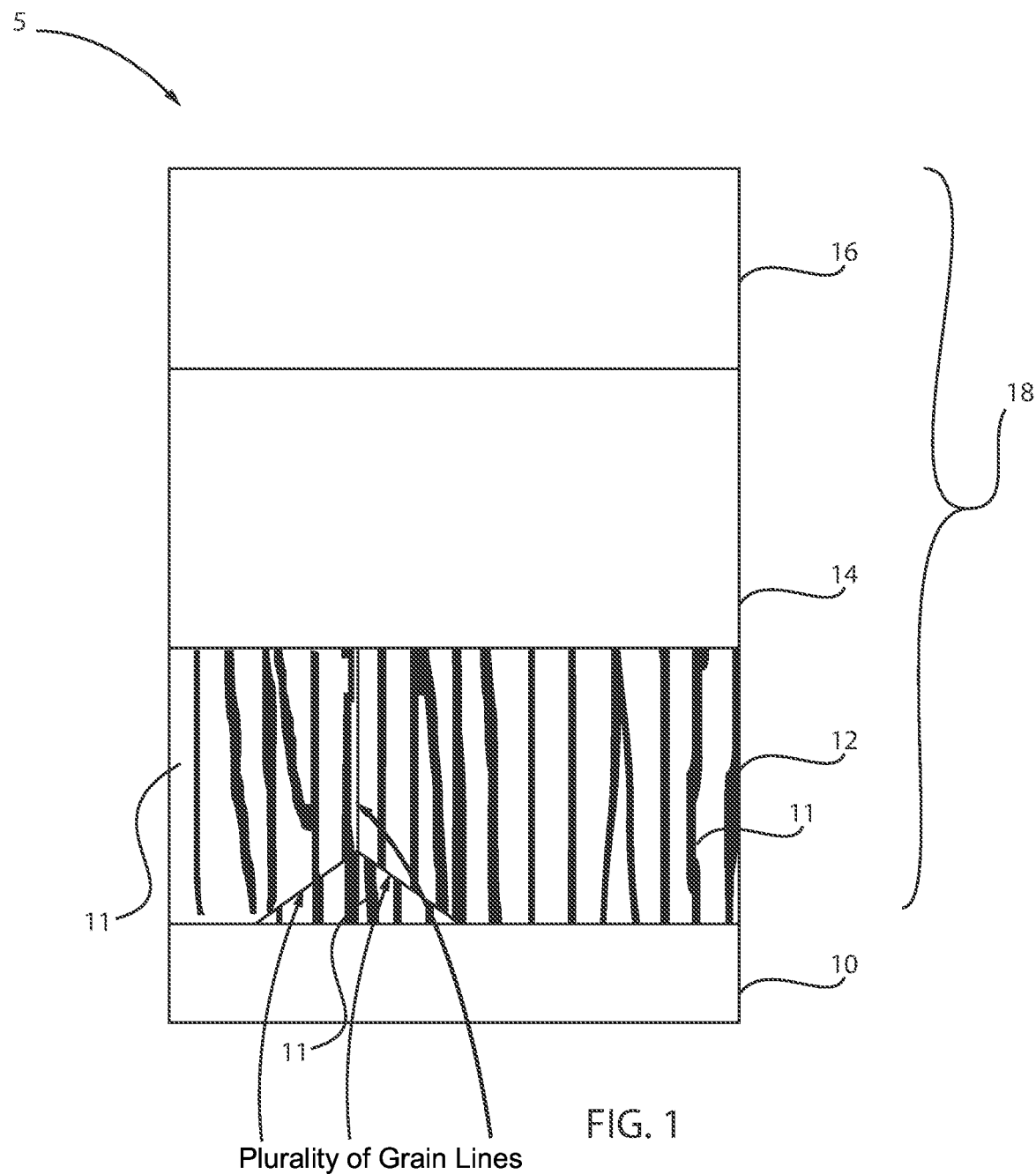
FIG. 1 is a cross-sectional view of a metal-insulator-metal (MIM) capacitor formed over a semiconductor structure including a layer defining columnar grains, in accordance with an embodiment of the present invention.

Embodiments in accordance with the present invention provide methods and devices to enhance a surface area for a stacked metal-insulator-metal (MIM) capacitor. In useful embodiments, at least one electrode is formed defining columnar grains. In particular, in one example, the MIM capacitor can include three layers. The first layer can be, e.g., a first electrode defining the columnar grains, the second layer can be a high-k layer, and the third layer can be, e.g., a second electrode. The three layers of the MIM capacitor can be formed over a substrate. This structure enhances a surface area of the first electrode and total utilization of a chip area is reduced. In one or more embodiments, titanium nitride (TiN) electrodes with columnar grains can be used to provide a capacitance increase and a leakage current reduction at the same time. Subsequent deposition of a high-k insulator by, e.g., atomic layer deposition (ALD) results in growth/deposition of high-k films in the grain boundaries of the TiN bottom electrode, which makes it easy to detect.

In the exemplary embodiments of the present invention, the columnar grains themselves serve the purpose of surface area enhancement and high-k deposition into the boundaries of the columnar grains is thus achieved. Moreover, deposition of the ALD high-k films on top of the bottom electrode with columnar grains is provided, which results in conformal deposition of an amorphous layer into the grain boundaries. The bottom electrode is, for example, a titanium nitride (TiN) bottom electrode with columnar grains formed therein.

In the exemplary embodiments of the present invention, a TiN/High-k/TiN stack is used for forming a MIM capacitor. The MIM capacitor can be formed on an interlayer dielectric (ILD), such as, but not limited to, silicon dioxide ($SiO_2$). The bottom TiN electrode can have columnar grains with a physical thickness of, e.g., greater than about 10 nm. The high-k layer includes, but is not limited to, $HfO_2$, $ZrO_2$, $Al_2O_3$, $Ta_2O_5$, and laminate films thereof. The high-k layer can be deposited by, for example, atomic layer deposition (ALD) to facilitate deposition in the grain boundaries of the columnar TiN bottom electrode. The top electrode includes, but is not limited to, TiN, tantalum nitride (TaN), and tungsten (W).

The above mentioned MIM structure enhances the surface area of the bottom electrode, thus providing for a larger capacitance for a given footprint area. This technique avoids leakage current increase and/or reliability degradation related to larger surface area. As a result, the total utilization of the chip area is reduced and/or the number of electrodes is reduced (e.g., from a 3-electrode structure to a 2-electrode plain MIM capacitor).

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium can all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this invention, contact and via refer to the completed structure.

As used herein, an "anisotropic etch process" denotes a material removal process in which the etch rate in the direction normal to the surface to be etched is greater than in the direction parallel to the surface to be etched. The anisotropic etch can include reactive-ion etching (RIE).

Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

ALD is a gas phase chemical process used to create extremely thin coatings. The majority of ALD reactions use two chemicals, typically called precursors. These precursors react with a surface one-at-a-time in a sequential manner. By exposing the precursors to the growth surface repeatedly, a thin film is deposited. ALD is a self-limiting, sequential surface chemistry that deposits conformal thin-films of materials onto substrates of varying compositions. ALD is similar in chemistry to chemical vapor deposition (CVD), except that the ALD reaction breaks the CVD reaction into two half-reactions, keeping the precursor materials separate during the reaction. ALD film growth is self-limited and based on surface reactions, which makes achieving atomic scale deposition control possible. By keeping the precursors separate throughout the coating process, atomic layer control of film grown can be obtained as fine as ~0.1 angstroms per monolayer. ALD has unique advantages over other thin film deposition techniques, as ALD grown films are conformal, pin-hole free, and chemically bonded to the substrate. With ALD it is possible to deposit coatings perfectly uniform in thickness inside deep trenches, porous media and around particles. The film thickness range is usually 1-500 nm. ALD can be used to deposit several types of thin films, including various ceramics, from conductors to insulators.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a cross-sectional view of a metal-insulator-metal (MIM) capacitor formed over a semiconductor structure including a layer defining columnar grains, in accordance with an embodiment of the present invention.

In fabricating the MIM structure 5, a bottom metallic electrode 12 is formed. The bottom metallic electrode 12 can be a single element or compound material, and/or it can be a combination of several materials, such as a bilayer or multilayer stack. The material of the bottom metallic electrode 12 can be, e.g., titanium nitride (TiN). The bottom metallic electrode 12 can optionally be formed on a substrate (not shown) as understood by one skilled in the art. The bottom metallic electrode 12 can have a columnar grain pattern 11. In one example embodiment, the bottom metallic electrode 12 is a TiN bottom electrode with a columnar grain pattern 11 extending therethrough or spanning a length, width, and/or height of the bottom electrode 12. The columnar grain structure 11 can have an uneven grain size.

In one or more embodiments, the substrate can be a semiconductor or an insulator. The substrate can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. The substrate can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. In one or more embodiments, the substrate can be a silicon wafer. In an embodiment, the substrate is a single crystal silicon wafer.

The bottom metallic electrode 12 can be formed over an interlayer dielectric (ILD) 10. In one or more embodiments, the ILD 10 can have a thickness in the range of about 20 nm to about 150 nm, or in the range of about 30 nm to about 50 nm.

The ILD 10 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by germanium (Ge), carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 10 include any of the aforementioned materials in porous form, or in a form that changes during processing to or from being porous and/or permeable to being non-porous and/or non-permeable.

In various embodiments, the height of the ILD 10 can be selectively reduced by chemical-mechanical polishing (CMP) and/or etching. Therefore, the planarization process can be provided by CMP. Other planarization process can include grinding and polishing.

A dielectric layer 14 can be formed on top of the bottom metallic electrode 12. The dielectric layer 14 can be a single compound material, and/or it can be a combination of several materials, such as a bilayer or multilayer stack. The material of the dielectric layer 14 can be, e.g., hafnium oxide (HfO$_2$). The dielectric layer 14 can act as an insulator. When forming the dielectric layer 14 on the bottom metallic electrode 12, a native oxide (not shown) can grow on the bottom metallic electrode 12. The native oxide is the oxidation of the bottom metallic electrode 12 when depositing the hafnium oxide to form the dielectric layer 14. The native oxide can be, e.g., TiO$_2$ or TiON when the bottom metallic electrode is titanium nitride. The native oxide grows from the material of the bottom metallic electrode and oxygen used to form the material of the dielectric layer 14.

In various embodiments, the dielectric layer 14 can be a high-k material.

The high-k material 14 can include but is not limited to metal oxides such as hafnium oxide (e.g., HfO$_2$), hafnium silicon oxide (e.g., HfSiO$_4$), hafnium silicon oxynitride (Hf$_w$Si$_x$O$_y$N$_z$), lanthanum oxide (e.g., La$_2$O$_3$), lanthanum aluminum oxide (e.g., LaAlO$_3$), zirconium oxide (e.g., ZrO$_2$), zirconium silicon oxide (e.g., ZrSiO$_4$), zirconium silicon oxynitride (Zr$_w$Si$_x$O$_y$N$_z$), tantalum oxide (e.g., TaO$_2$, Ta$_2$O$_5$), titanium oxide (e.g., TiO$_2$), barium strontium titanium oxide (e.g., BaTiO$_3$-SrTiO$_3$), barium titanium oxide (e.g., BaTiO$_3$), strontium titanium oxide (e.g., SrTiO$_3$), yttrium oxide (e.g., Y$_2$O$_3$), aluminum oxide (e.g., Al$_2$O$_3$), lead scandium tantalum oxide (Pb(Sc$_x$Ta$_{1-x}$)O$_3$), and lead zinc niobate (e.g., PbZn$_{1/3}$Nb$_{2/3}$O$_3$). The high-k material 14 can further include dopants such as lanthanum and/or aluminum. The stoichiometry of the high-k compounds can vary.

In various embodiments, the high-k material 14 can have a thickness in the range of about 3 nm to about 10 nm.

The material for the top metallic electrode 16 and the bottom metallic electrode 12 can be selected from, but is not limited to, Pt, TiN, TiC, TaN, TaC, CoFeB, W, as well as combinations thereof. Also, the layers of the MIM structure 5 can be formed, for example, by chemical vapor deposition (CVD), physical vapor deposition (PVD), atomic layer deposition (ALD), and/or other techniques known in the art.

Therefore, in one exemplary embodiment, a TiN 12/High-k 14/TiN 16 stack can be used for forming the MIM capacitor 20. The MIM capacitor 20 can be formed on an interlayer dielectric (ILD) 10. The bottom TiN 12 has columnar grains with a physical thickness of, for example, greater than 10 nm. The high-k layer 14 includes, but is not limited to, HfO$_2$, ZrO$_2$, Al$_2$O$_3$, Ta$_2$O$_5$, and laminate films thereof. The high-k layer 14 can be deposited by, for example, ALD to facilitate deposition in the grain boundaries of the columnar TiN bottom electrode 12. The top electrode 16 includes, but not limited to, titanium nitride (TiN), tantalum nitride (TaN), and tungsten (W). The columnar grains 11 can serve the purpose of surface area enhancement. The high-k deposition of dielectric layer 14 into the boundaries of the columnar grains 11 is also achieved. This results in conformal deposition of an amorphous layer into the grain boundaries. The high-k material 14 can be deposited into the grain boundaries by, e.g., ALD.

Figure 2:
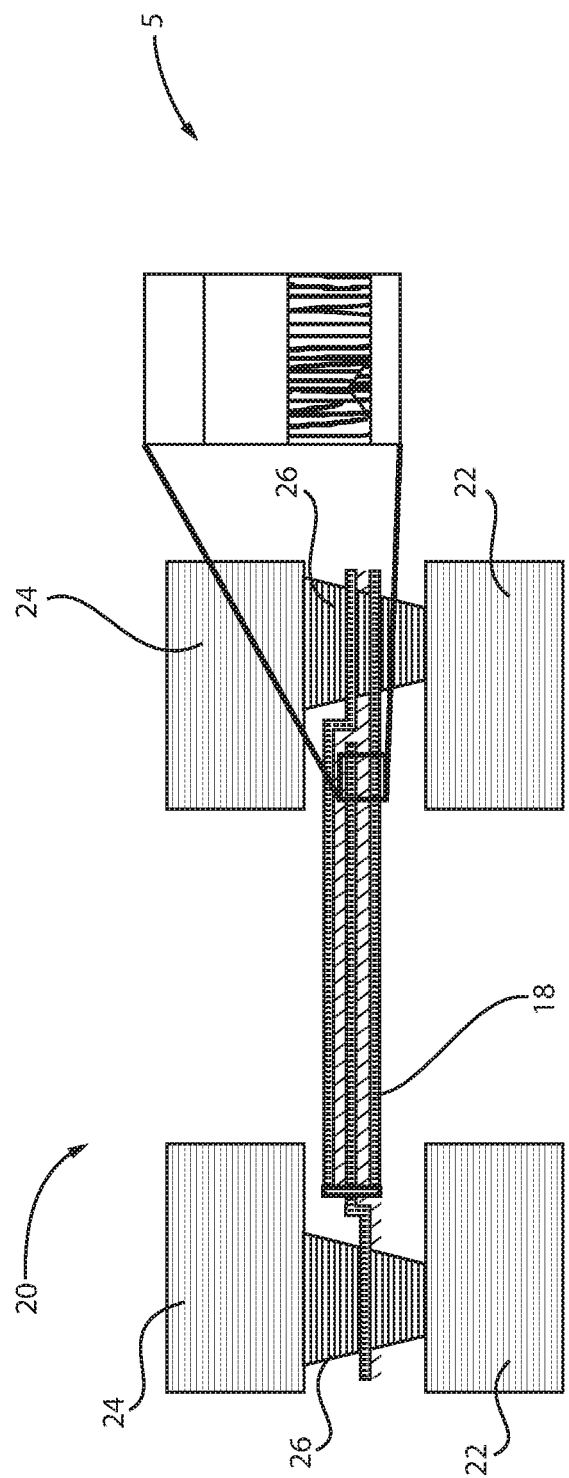
FIG. 2 is the (MIM) capacitor of FIG. 1 shown inserted in a simplified view of back-end-of-the-line (BEOL) processing, in accordance with an embodiment of the present invention.

FIG. 2 is the (MIM) capacitor of FIG. 1 shown inserted in a simplified view of back-end-of-the-line (BEOL) processing, in accordance with an embodiment of the present invention.

In various example embodiments, the MIM structure 5 can be inserted into structure 20. Structure 20 depicts metal lines 22 and metal lines 24. Metals 22 can be the first metallization layer (M1), whereas metals 24 can be the second metallization layer (M2). Vias 26 can be formed between metals 22 and metals 24. The MIM capacitor 18 can be positioned, e.g., between metals 22 and 24. Therefore, in one exemplary embodiment, the MIM capacitor 18 of the present invention can be inserted into such a structural configuration. Of course, one skilled in the art can contemplate the MIM capacitor 18 being inserted into a number of other different semiconductor structures.

Figure 3:
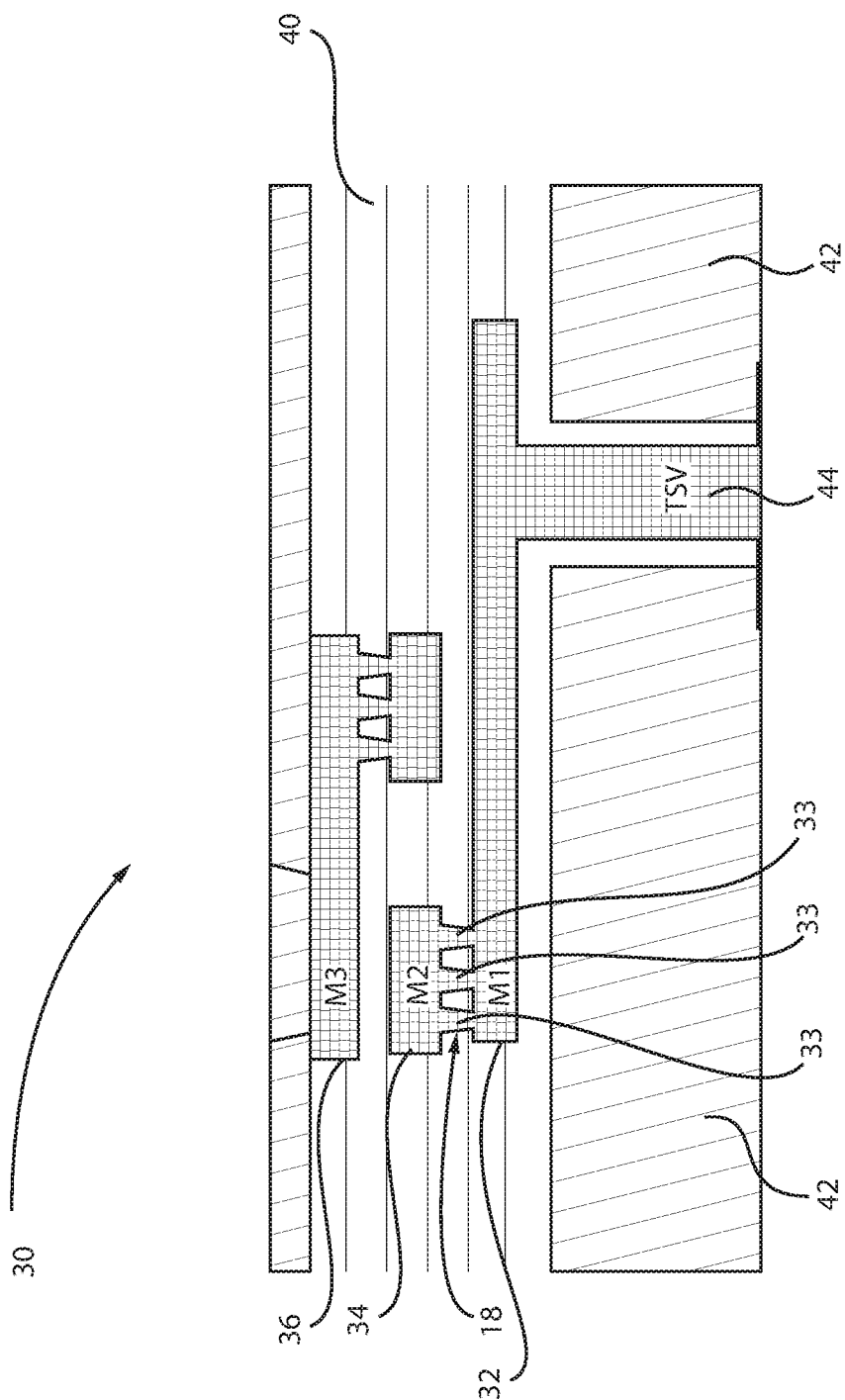
FIG. 3 is the (MIM) capacitor of FIG. 1 shown inserted in between metal 1 (M1) and metal 2 (M2) of an example simplified silicon (Si) interposer, in accordance with an embodiment of the present invention.

FIG. 3 is the MIM capacitor of FIG. 1 shown inserted in between metal 1 (M1) and metal 2 (M2) of an example simplified silicon (Si) interposer, in accordance with an embodiment of the present invention.

In various example embodiments, the MIM capacitor 18 can be inserted into structure 30. Structure 30 depicts a simplified example of a silicon interposer configuration. Structure 30 depicts metal lines 32 and metal lines 34. Metals 32 can be metal M1, whereas metals 34 can be metal M2. Vias 33 can be formed between metals 32 and metals 34. The MIM capacitor 18 can be positioned, e.g., between metals 32 and 34. Additionally, metals 36 are shown. Metals 36 an be metal M3. The metals M1, M2, M3 can be covered by a dielectric layer 40. Dielectric layer 40 can be, e.g., SiO$_2$.

The contact M1 can also include a through-silicon via (TSV) 44 that extends through a Si interposer 42. Silicon interposers play an important role during the manufacturing process of a multi-chip or 3D chip stack. 3D chip stack technology provides a method to vertically stack one integrated circuit (IC) upon another. The IC chips that make up the 3D chip stack and utilize through silicon vias (TSVs) to interconnect multiple chips within the 3D chip stack are referred to herein as silicon interposers. A 3D chip stack can provide a reduction in overall size and power consumption in comparison to some conventional single substrate IC package designs. MIM capacitors 18 can be inserted into such silicon interposers. Of course, one skilled in the art can contemplate the MIM capacitor 18 being inserted into a number of other different semiconductor structures.

FIGS. 2 and 3 are merely exemplary structures which can be configured to receive such MIM capacitors 18 described herein. In no way are the exemplary embodiments of the present invention limited to only these two structures.

Figure 4:
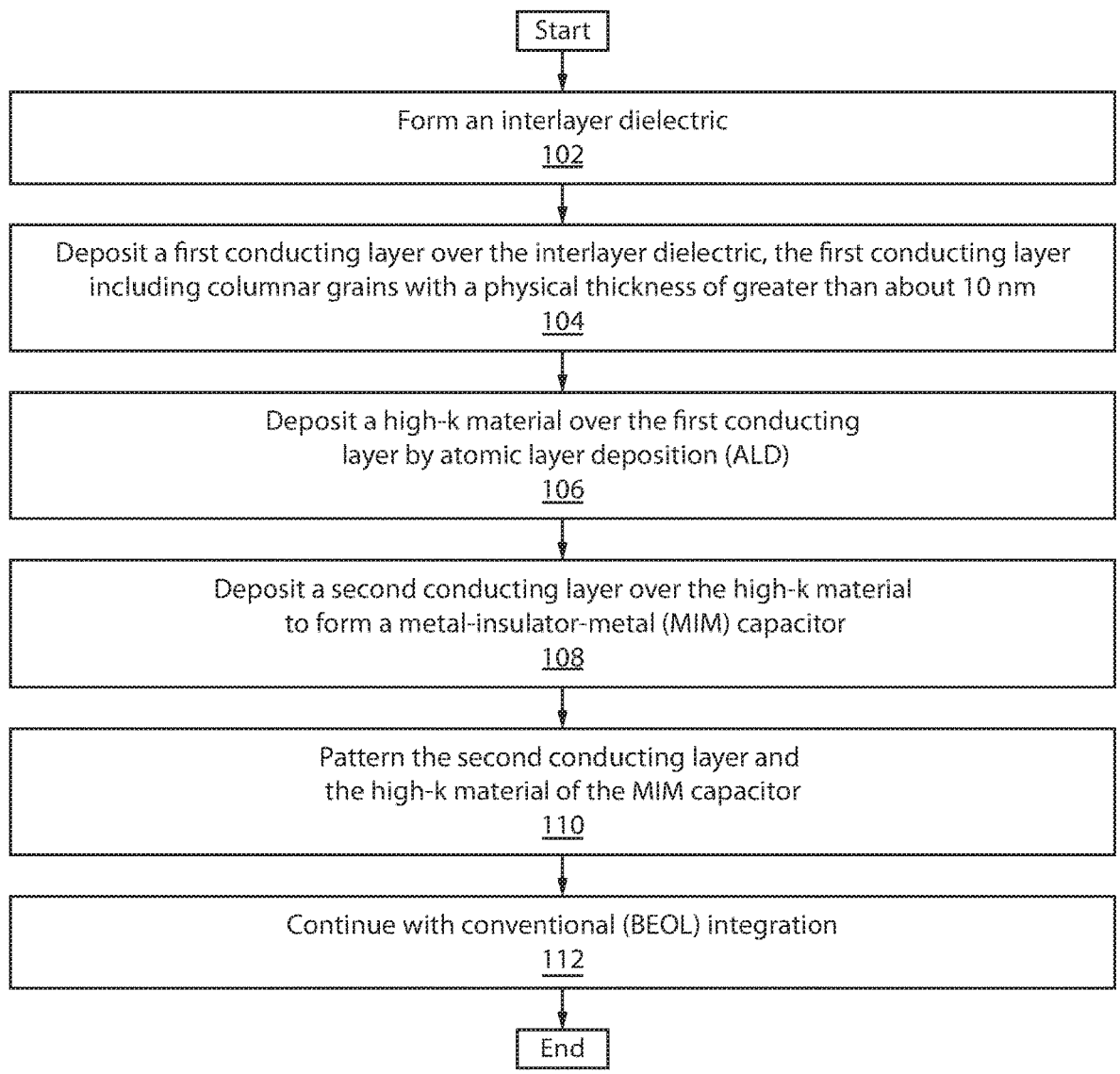
FIG. 4 is a block/flow diagram of an exemplary method for forming an electrode defining columnar grains, in accordance with an embodiment of the present invention.

FIG. 4 is a block/flow diagram of an exemplary method for forming an electrode defining columnar grains, in accordance with an embodiment of the present invention.

At block 102, an interlayer dielectric is formed.

At block 104, a first conducting layer is deposited over the interlayer dielectric, the first conducting layer including columnar grains with a physical thickness of greater than about 10 nm.

At block 106, a high-k material is deposited over the first conducting layer by atomic layer deposition (ALD).

At block 108, a second conducting layer is deposited over the high-k material to form a metal-insulator-metal (MIM) capacitor.

At block 110, the second conducting layer and the high-k material of the MIM capacitor are patterned.

At block 112, continue with conventional BEOL integration.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

The MIM capacitor of the exemplary embodiments of the present invention can be formed in back end of line (BEOL) interconnects. Concerning BEOL, a layer of dielectric material is blanket deposited atop the entire substrate and planarized. The blanket dielectric can be selected from the group consisting of silicon-containing materials such as $SiO_2$, $Si_3N_4$, SiOxNy, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to or from being porous and/or permeable to being non-porous and/or non-permeable.

The blanket dielectric can be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited dielectric is then patterned and etched to forth via holes to the various source/drain and gate conductor regions of the substrate. Following via formation interconnects can be formed by depositing a conductive metal into the via holes using conventional processing, such as CVD or plating. The conductive metal can include, but is not limited to: tungsten, copper, aluminum, silver, gold, and alloys thereof. The BEOL layer can comprise one or multiple stacks of wires/vias.

The exemplary embodiments of the present invention can be used, for example, for DRAM and eDRAM applications. DRAM (dynamic random access memory) is a type of random access memory that stores each bit of data in a separate capacitor within an integrated circuit. Since real capacitors leak charge, the information eventually fades unless the capacitor charge is refreshed periodically. Because of this refresh requirement, it is a dynamic memory as opposed to SRAM and other static memory. Its advantage over SRAM is its structural simplicity: only one transistor and a capacitor are required per bit, compared to six transistors in SRAM. This allows DRAM to reach very high density. Like SRAM, it is in the class of volatile memory devices, since it loses its data when the power supply is removed.

eDRAM (embedded dynamic random access memory) is a capacitor-based dynamic random access memory usually integrated on the same die or in the same package as the main ASIC (application-specific integrated circuit) or processor, as opposed to external DRAM modules and transistor-based SRAM (static random access memory) typically used for caches.

In summary, a TiN electrode is used with columnar grain structures. Deposition and diffusion of high-k films into the grain boundaries of the bottom TiN electrode is then performed. This invention enables capacitance enhancement and leakage current reduction simultaneously, which is not achievable with conventional surface area enhancement techniques.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated to achieve surface area enhancement by using a stacked metal-insulator-metal (MIM) capacitor (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a metal-insulator-metal (MIM) capacitor on a semiconductor substrate, the method comprising:
    forming a first electrode defining columnar grains extending in the MIM capacitor;
    forming a dielectric layer in direct contact with an entire upper surface of the first electrode; and
    forming a second electrode in direct contact with the dielectric layer;
    wherein deposition of the dielectric layer causes growth of high-k films in columnar grain boundaries and the deposition results in a conformal amorphous layer into the columnar grain boundaries,
    wherein the conformal amorphous layer is formed of a first process step using a plasma-enhanced atomic layer deposition (PE-ALD) process and a second process step of a fill using a chemical vapor deposition (CVD) process,
    forming a plurality of grain lines in the first electrode, wherein a grain line of the plurality of grain lines is defined as a single straight line, the single straight line offsetting the columnar grains;
    wherein no single straight line directly contacts simultaneously both the upper surface of the first electrode directly contacting the dielectric layer and a lower surface of the first electrode directly contacting an inter-layer dielectric (ILD).

2. The method of claim 1, wherein the first electrode is a titanium nitride (TiN) electrode.

3. The method of claim 1, wherein the second electrode is a TiN electrode.

4. The method of claim 1, wherein the dielectric layer is a high-k insulator.

5. The method of claim 1, wherein the dielectric layer includes one of hafnium oxide and zirconium oxide.

6. The method of claim 5, wherein the dielectric layer is deposited by atomic layer deposition (ALD).

7. The method of claim 1, wherein the columnar grains enable surface area enhancement.

8. The method of claim 1, wherein no single grain boundary extends from a proximalmost end to a distalmost end of the electrode.

9. A method for forming a high capacitance density stacked capacitor structure, the method comprising:
   forming an electrode over an interlayer dielectric (ILD), the electrode including columnar grains extending in the high capacitance density stacked capacitor structure; and
   depositing a high-k insulator over the electrode by atomic layer deposition (ALD), the ALD causing growth of high-k films in columnar grain boundaries and the deposition resulting in a conformal amorphous layer into the columnar grain boundaries,
   wherein the conformal amorphous layer is formed of a first process step using a plasma-enhanced atomic layer deposition (PE-ALD) process and a second process step of a fill using a chemical vapor deposition (CVD) process,
   forming a plurality of grain lines in the first electrode, wherein a grain line of the plurality of grain lines is defined as a single straight line, the single straight line offsetting the columnar grains;
   wherein no single straight line directly contacts simultaneously both the upper surface of the first electrode directly contacting the dielectric layer and a lower surface of the first electrode directly contacting an inter-layer dielectric (ILD).

10. The method of claim 9, wherein the electrode is a titanium nitride (TiN) electrode.

11. The method of claim 9, wherein another electrode is formed over the high-k insulator.

12. The method of claim 11, wherein the high-k insulator includes one of hafnium oxide and zirconium oxide.

13. The method of claim 9, wherein the columnar grains enable surface area enhancement.

14. The method of claim 9, wherein the columnar grains of the electrode have a thickness greater than about 10 nm.

15. The method of claim 9, wherein no single grain boundary extends from a proximalmost end to a distalmost end of the electrode.

* * * * *